US007126866B1

(12) United States Patent
Poplevine et al.

(10) Patent No.: US 7,126,866 B1
(45) Date of Patent: Oct. 24, 2006

(54) LOW POWER ROM ARCHITECTURE

(75) Inventors: Pavel Poplevine, Foster City, CA (US); Ernes Ho, Sunnyvale, CA (US); Hengyang Lin, San Jose, CA (US); Andrew J. Franklin, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 445 days.

(21) Appl. No.: 10/215,699

(22) Filed: Aug. 10, 2002

(51) Int. Cl.
*G11C 7/00* (2006.01)

(52) U.S. Cl. .................... 365/203; 365/204; 365/205

(58) Field of Classification Search ............... 365/203, 365/204, 205, 230.02, 207, 185.21, 209, 365/145, 158, 171, 170
See application file for complete search history.

(56) References Cited

U.S. PATENT DOCUMENTS

| 4,791,604 | A | * | 12/1988 | Lienau et al. ............... 365/53 |
| 4,905,197 | A | * | 2/1990 | Urai ....................... 365/185.25 |
| 5,025,416 | A | * | 6/1991 | Prinz .......................... 365/170 |
| 5,434,822 | A | * | 7/1995 | Deleganes et al. .......... 365/203 |
| 5,453,955 | A | * | 9/1995 | Sakui et al. ................. 365/203 |
| 6,016,269 | A | * | 1/2000 | Peterson et al. ............ 365/171 |
| 6,285,590 | B1 | * | 9/2001 | Poplevine et al. ...... 365/185.21 |
| 6,515,897 | B1 | * | 2/2003 | Monsma et al. ............ 365/173 |
| 6,525,967 | B1 | * | 2/2003 | Briner ................... 365/185.21 |
| 6,621,758 | B1 | * | 9/2003 | Cheung et al. ......... 365/230.03 |
| 6,628,557 | B1 | * | 9/2003 | Hsu et al. ................... 365/204 |
| 6,731,266 | B1 | * | 5/2004 | Jung .......................... 345/103 |
| 6,862,245 | B1 | * | 3/2005 | Kim et al. ............. 365/230.05 |

\* cited by examiner

*Primary Examiner*—Huan Hoang
(74) *Attorney, Agent, or Firm*—Jurgen Vollrath

(57) ABSTRACT

In a ROM structure, power consumption is reduced by providing for pre-discharging of only the bit line corresponding to the memory location that is being read. Column select lines are coupled to logic to switch in a pre-discharging circuit prior to reading, and to disconnect, from the pre-discharging circuit during reading, only the bit line corresponding to the memory location being read.

18 Claims, 4 Drawing Sheets

LOW POWER ROM ARCHITECTURE

FIELD OF THE INVENTION

The invention relates to semiconductor memories and in particular to Read Only Memories (ROM), with a view to reducing power consumption.

BACKGROUND OF THE INVENTION

A read only memory (ROM) structure comprises a matrix of intersecting bit lines and word lines with memory cells at select intersections. The structure is typically operated in one of two different modes: pre-charge and read. The need to pre-charge bit lines prior to a read operation causes much of the power consumption of the structure, due to charging of the bit lines themselves, as well as the power consumed by the pre-charging circuit which has to toggle through charge cycles whenever there is a read operation. FIG. 1 shows a simple prior art ROM structure 100 comprising a matrix of bit lines 102 and word lines 104 having memory cells in the form of NMOS transistors 106 at certain crossover points, thereby defining a structure with a predefined code "written" into it. A pre-charge circuit comprising PMOS transistors 108 is shown, which provides a PMOS transistor 108 for each bit line to allow each bit line 102 to be pre-charged to VDD prior to a read operation. A logic low pre-charge signal PRCH is applied to the gates of the PMOS transistors 108 to cause current to pass up through the bit lines, thereby charging the bit lines 102 prior to a read operation. During this pre-charge mode, the word lines 104 are kept low to switch off the transistors 106, thereby charging the bit lines 102. During a read operation, one of the intersections is selected by selecting a word line (word line goes high) and selecting a bit line by means of the switches 110. In addition, the PRCH signal goes high. By having a high on the selected word line 104, the transistors 106 on that word line are switched on. If the chosen intersection between that word line and the selected bit line 108 has a NMOS transistor 106, the selected bit line 102 has a current path to ground through the transistor 106. This causes any current on the selected bit line to flow through the bit line to ground, allowing the current to be detected by the sense amplifier 112. Thus, if the selected intersection in the matrix includes a memory cell (NMOS transistor 106), current flow is detected. However, it will be appreciated that all of the other bit lines with memory cells on the selected word line will also discharge to ground. These all have to be pre-charged prior to the next read operation, causing considerable power to be consumed. Furthermore, during static mode, the bit lines are high and word lines are low, thus resulting in considerable DC leakage, corresponding to the number of transistors 106.

One proposed solution has been to provide for a pre-discharging of the bit lines instead of a pre-charging. In such a solution, as shown in FIG. 2, there is a special pre-discharge circuit 202 with NMOS transistors 204 which provide a current path to ground when switched on by pre-discharge signal (PRDCHG) 208 which controls all pre-discharge transistors in the pre-discharge circuit 202. During pre-discharge mode all word lines 206 are low and PRDCHG signal 208 is high. This allows all bit lines 210 to discharge through transistors 204. During a read operation, one of the word lines 206 is selected by going high and one of the bit lines 210 is selected by means of multiplexer switches 212. Also, the transistors of the pre-discharge circuit 202 are switched off. Thus, for example, if one wanted to read bit line 214 (BL0), all pre-discharge transistors 204 would be closed (non-conducting), and current supplied by the sense amplifier circuit 220 would flow up through the selected bit line 214 to ground via the selected transistor 206. Thus, there is no unnecessary charging and discharging of bit lines. However, there is still substantial power consumption involved in toggling the transistors 204 of the pre-discharge circuit 202 due to charging of the transistors 204 even when they are not being selected during a read operation. Thus there is a substantial load provided to the PRDCHG signal 208 by the string of transistors 204.

The present invention seeks to provide a lower power consumption solution.

SUMMARY OF THE INVENTION

The invention provides a method and an architecture for reducing power consumption in a Read Only Memory (ROM).

According to the invention, there is provided a method for providing a low power ROM structure, comprising performing a pre-discharging step prior to a read operation, wherein the pre-discharging step includes selective connection and disconnection of one or more bit lines selected from the total number of bit lines, to and from a pre-discharging circuit. The ROM structure typically includes a matrix of bit lines selectable by column select (Y-select) lines, and word lines selectable by word select (X-select) lines, wherein the selective connection may include selecting a particular bit line using column select lines of the ROM structure. The method typically includes maintaining a DC leakage current path to ground during a read operation, for bit lines not being read. The read operation typically includes providing Y-address signals on column select lines, to select a particular bit line for reading, and the method may include using the Y-address signals to disconnect the bit line from the pre-discharging circuit. The changing state of the Y-address signals may be used to first pre-discharge the bit line prior to disconnecting the bit line from the pre-discharging circuit. The method may include connecting the bit line to a sense amplifier after the pre-discharging, to facilitate reading. Preferably, the same signal used to disconnect the bit line from the pre-discharging circuit, is used to connect the bit line to the sense amplifier. Thus the signal may include a low to high going pulse or a high to low going pulse that connects the pre-discharge circuit to the bit line prior to the pulse arriving, and switches in a current sensor and disconnects the pre-discharge circuit when the pulse arrives.

Further, according to the invention, there is provided a ROM structure, comprising a memory core with a matrix of bit lines and word lines, a plurality of memory cells at predetermined intersections of the bit lines and word lines, a pre-discharging circuit, a read circuit, and logic to select specific bit lines from among the total number of bit lines, for pre-discharging. The bit lines selected for pre-discharging typically are the same as the bit lines selected during a subsequent read operation. The logic for selecting specific bit lines for pre-discharging may be controlled by Y-address signals on column select lines. The structure may, further, include circuitry for detecting a memory cell at a particular intersection, such as a sense amplifier, and preferably includes logic for selectively connecting the sense amplifier to a selected bit line. Preferably the Y-address signals controlling the logic for selecting specific bit lines for pre-discharging also control the logic for selectively connecting the sense amplifier. Typically, the logic for selecting specific bit lines for pre-discharging and the logic for selectively connecting the sense amplifier during a read operation, are configured to allow either pre-discharging or connection to the sense amplifier at any one time but not both. Thus, during a read operation the pre-discharging circuit will be disconnected and the sense amplifier will be connected.

DETAILED DESCRIPTION OF THE INVENTION

Figure 3:
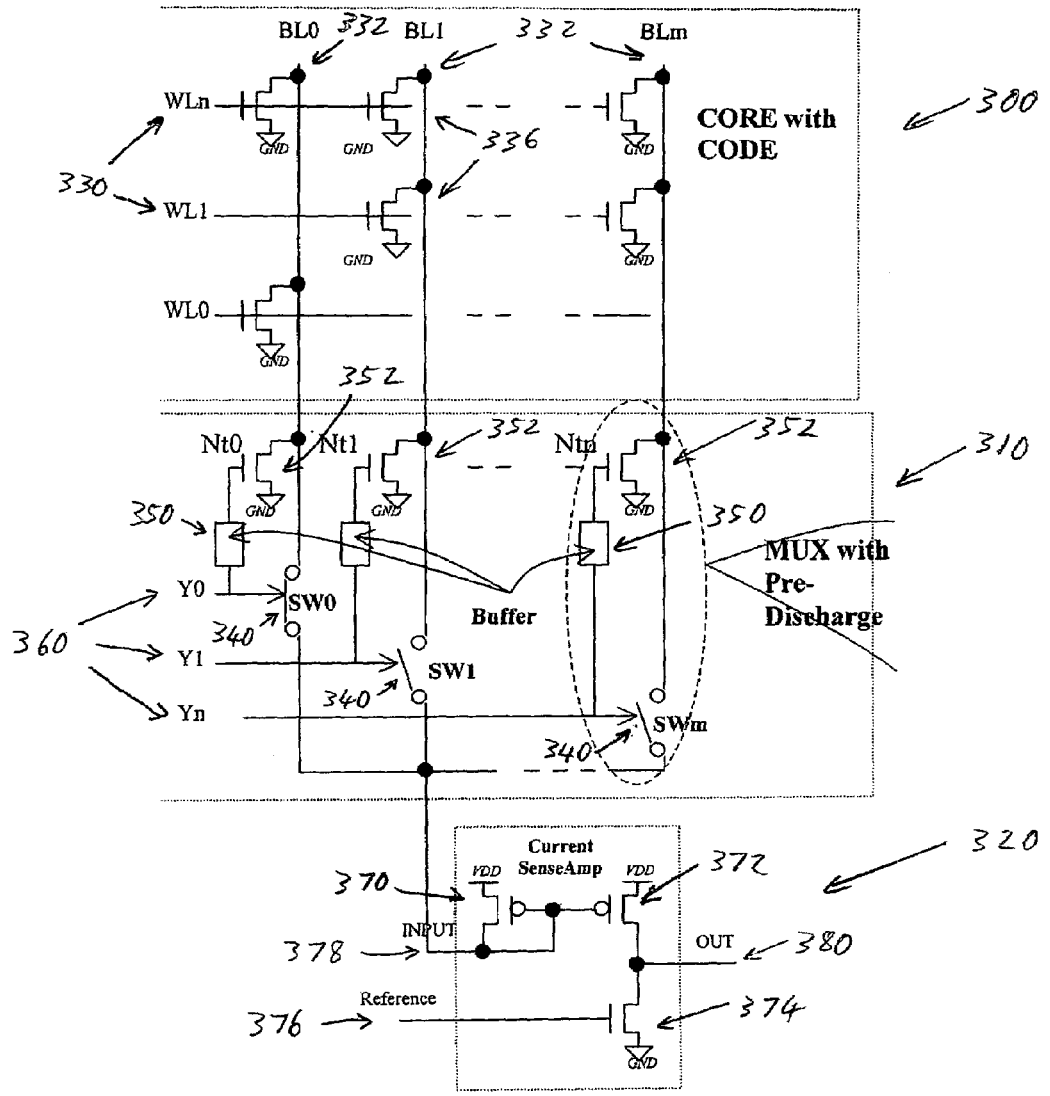
FIG. 3 is one embodiment of a ROM structure of the invention showing one embodiment of a sense amplifier.

The Read Only Memory (ROM) structure shown in FIG. 3 includes a memory core 300, select logic circuitry 310, and a current sense amplifier 320. The memory core 300 is made up of a matrix of intersecting word lines 330 and bit lines 332. At defined intersections or nodes of the word lines 330 and bit lines 332, memory cells are included in the form of transistors 336. Since these memory locations (intersections) do not all contain memory cells, the ROM, in effect, is programmed with code by virtue of the distribution of memory cells. While the present invention will be described with respect to a ROM structure, it will be appreciated that the invention is equally applicable to other cores such as EPROMs or EEPROMs.

The drains of the transistors 336 are connected to the bit lines 332, with the sources connected to ground. The word lines 330, in turn control the gates of the transistors 336. In order to read the ROM at a particular location, the location of interest is monitored for current flow. The existence or non-existence of a memory cell at a particular location determines whether there will be current flow through the corresponding bit line 332. Such a reading step is performed by applying a logic high to the bit line and word line that intersect at the memory location of interest. In particular, a logic high is applied to the corresponding word line 330 and the appropriate switch 340 of select logic circuitry 310 (which, in this embodiment includes a multiplexer). By applying a high to the appropriate switch 340, a current path is established from the sense amplifier 320 to the corresponding bit line 332. This becomes clearer from the embodiment of a selection circuit shown in FIG. 4, which shows one of the switches 340 in the form of a NMOS transistor 400. The buffers 350 shown in FIG. 3 comprise inverters 402. The inverters are connected to NMOS transistors 404, which in FIG. 3 are depicted as NMOS transistors 352.

Figure 4:
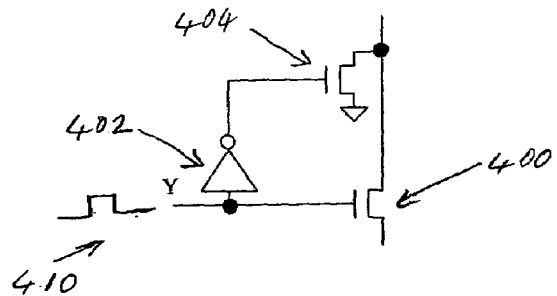
FIG. 4 is one embodiment of an element of a selection circuit used in the structure of FIG. 3.

The switches 340 in FIG. 3 are controlled by Y-address signals on Y-select (column select) lines 360 (indicated in FIG. 4 as column select line 410)

Thus, during a read operation, in a previously discharged ROM structure as shown in FIG. 3, current is supplied by the sense amplifier 320, which also serves to monitor the current flow. The current sense amplifier 320 illustrate in this embodiment consists of a current mirror circuit comprising two PMOS transistors 370, 372 with their gates connected. Transistor 370 is connected with its source at VDD and its drain and gate connected to the bit lines through the multiplexer of the select circuit 310. The transistor 372 also has its source connected to VDD. Its drain forms the output to the current sense amplifier and is biased by means of a NMOS transistor 374, the gate of which is controlled by a reference voltage 376. During a read operation, when the selected memory location has a transistor (memory cell) 336, the transistor 336 switches on and ties the bit line low. The input terminal 378 of the current sense amplifier 320 thus sees a low. Thus transistor 370 switches on and supplies current to the selected bit line 332. A corresponding current flows through the transistor 372, which makes up the other branch of the current mirror, thus pulling the output 380 up to VDD. On the other hand, if the selected memory location does not include a transistor 336, the input terminal 376 floats and no current flows through the current mirror. In this way a particular memory location (node) can be read to detect the presence or absence of a memory cell at the particular memory location.

As mentioned above, prior to a read operation, the bit line is pre-discharged. This is done by discharging the bit line through its corresponding transistor 352 (transistor 404 in FIG. 4). Referring to FIG. 4, a square positive going pulse signal will initially present a low on the column select line 410, thereby switching on transistor 404 and switching off transistor 400. This constitutes a pre-discharge of a particular bit line 332 as determined by the address on the column select lines 360 (FIG. 3). Once the signal goes high, transistor 404 turns off and transistor 400 turns on to connect the sense amplifier circuit 320 to the bit line as part of the read operation. Further, the word line 330 that corresponds to the node to be read, is switched high during this read operation. (During the pre-discharge mode, all word lines are held low).

Figure 1:
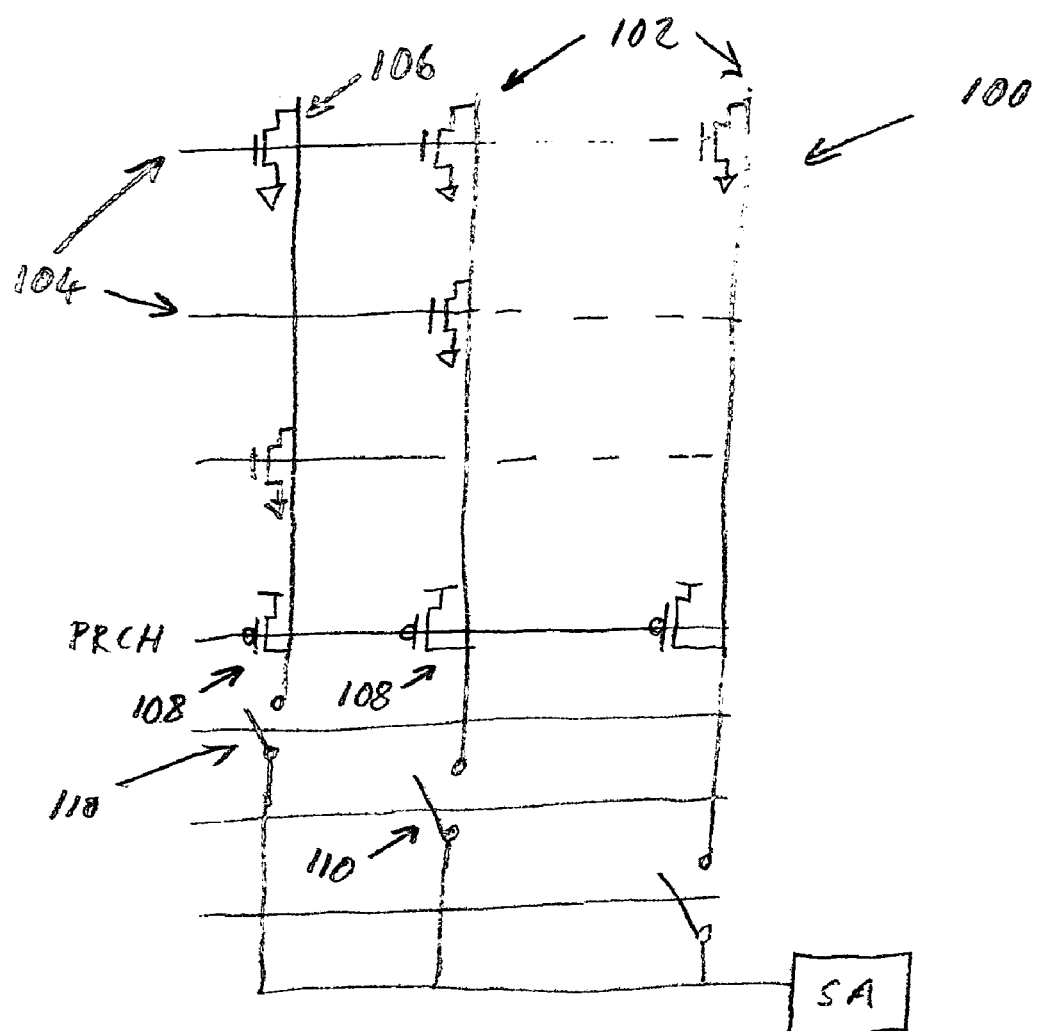
FIG. 1 is a schematic circuit diagram of a prior art ROM structure.
Figure 2:
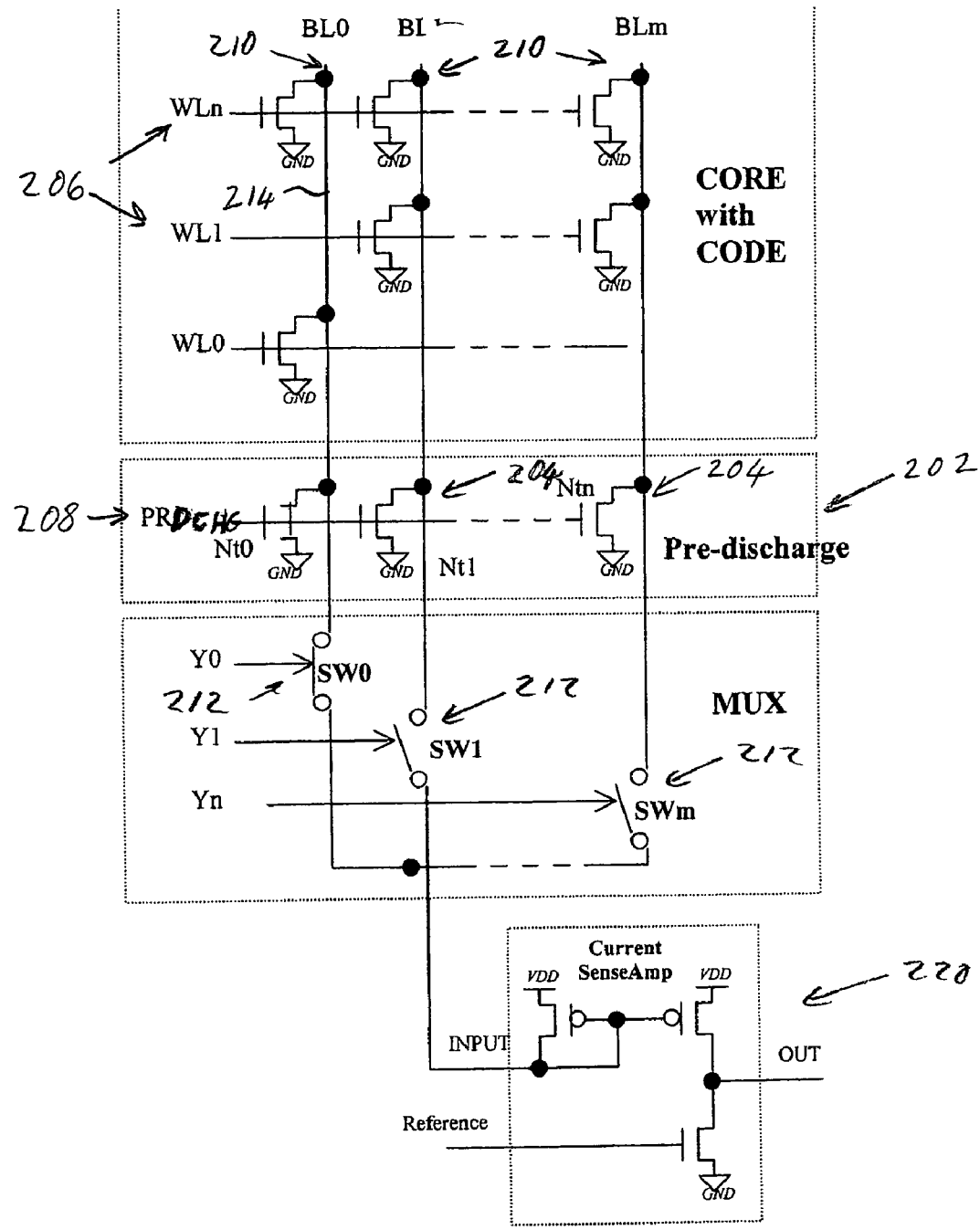
FIG. 2 is a schematic circuit diagram of another prior art ROM structure.

Thus, it will be appreciated that the present ROM structure allows only a single switching transistor to be toggled for pre-discharging and reading as opposed to the prior art circuit of FIG. 2 in which an entire row of transistors in the pre-discharge circuit was toggled. Thus the present invention provides for much lower power consumption. The structure of the invention does not have this problem since the bit lines that are not being read remain discharged during the read operation (since only one of the column select lines 360 goes high during the read operation while the others remain low to maintain a current path to ground through the transistors 352).

Figure 5:
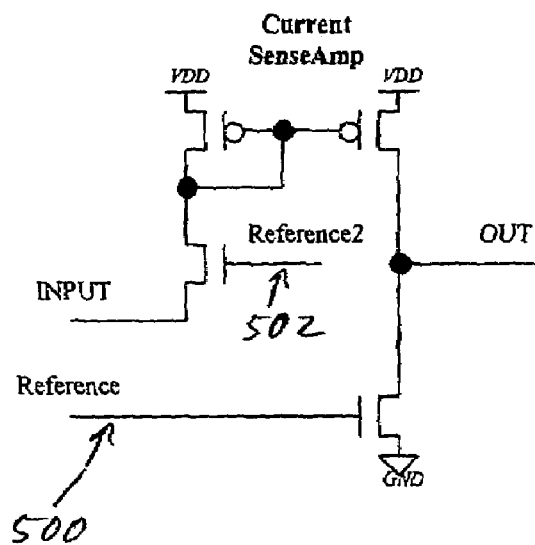
FIG. 5 is another embodiment of a sense amplifier usable with the structure of FIG. 3.
Figure 6:
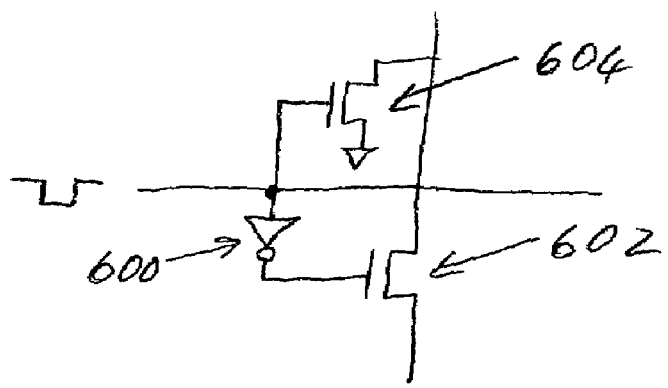
FIG. 6 is another embodiment of an element of a selection circuit used in the structure of FIG. 3.

It will be appreciated that the present invention can be implemented in different ways without departing from the scope of the invention as defined in the claims. For example, FIG. 5 shows another embodiment of a sense amplifier of the invention. This embodiment makes use of two Reference voltages 500, 502 and thus allows an output to be measured at a lower voltage on the input depending on the reference voltage 502 (reference2). Also, variations can be provided for the elements of the selection circuit. For instance, if the column address signals on the column select lines are low-going signals, a circuit such as the one shown in FIG. 6 can be used. In this embodiment an inverter 600 is connected to the switching transistor 602 rather than the pre-discharge transistor 604. It will be appreciated that these embodiments are merely given by way of example, and other variations can be provided without departing from the scope of the invention.

What is claimed is:

1. A method for providing a low power ROM structure, comprising performing a pre-discharging step prior to a read operation, wherein the pre-discharging step includes selective connection and disconnection of individual selected bit lines, selected from the total number of bit lines, to and from a pre-discharging circuit, and connecting the bit line to a sense amplifier after the pre-discharging, to facilitate reading without the need for pre-charging any of the bit lines.

2. A method of claim 1, wherein the ROM structure includes a matrix of bit lines selectable by column select lines, and word lines selectable by word select (X-select) lines, wherein the selective connection includes selecting a particular bit line using the column select lines of the ROM structure.

3. A method of claim 1, wherein the method includes maintaining a DC leakage current path to ground during a read operation, for bit lines not being read.

4. A method of claim 2, wherein the read operation includes providing a Y-address signal on a column select line, to select a particular bit line for reading.

5. A method of claim 4, further including using the Y-address signal to disconnect the bit line from the pre-discharging circuit.

6. A method of claim 5, wherein the changing state of the Y-address signal is used to first pre-discharge the bit line prior to disconnecting the bit line from the pre-discharging circuit.

7. A method of claim 1, wherein the same signal used to disconnect the bit line from the pre-discharging circuit, is used to connect the bit line to the sense amplifier.

8. A method of claim 7, wherein the signal includes a low to high going pulse that connects the pre-discharging circuit to the bit line prior to the pulse arriving, and switching in a current sensor and disconnecting the pre-discharging circuit when the pulse arrives.

9. A method of claim 7, wherein the signal includes a high to low going pulse that connects the pre-discharging circuit to the bit line prior to the pulse arriving, and switching in a current sensor and disconnecting the pre-discharging circuit when the pulse arrives.

10. A ROM structure, comprising a memory core with a matrix of bit lines and word lines, a plurality of memory cells at predetermined intersections of the bit lines and word lines, a pre-discharging circuit, a read circuit, and logic to select individual specific bit lines from the total number of bit lines, for pre-discharging and for thereafter connecting the read circuit to read one or more specific bit lines, the read circuit providing current to said one or more specific bit lines thereby avoiding the need for pre-charging any of the bit lines prior to reading.

11. ROM structure of claim 10, wherein the individual bit lines selected for pre-discharging are the same as the individual bit lines selected during a subsequent read operation.

12. A ROM structure of claim 11, wherein the logic for selecting individual specific bit lines for pre-discharging is controlled by Y-address signals on column select lines.

13. A ROM structure of claim 12, further including circuitry for detecting a memory cell at a particular intersection.

14. A ROM structure of claim 13, wherein the circuitry for detecting comprises a sense amplifier.

15. A ROM structure of claim 14, further including logic for selectively connecting the sense amplifier to a selected bit line.

16. A ROM structure of claim 15, wherein the Y-address signals controlling the logic for selecting a specific bit line for pre-discharging also control the logic for selectively connecting the sense amplifier.

17. A ROM structure of claim 15, wherein the logic for selecting a specific bit line for pre-discharging and the logic for selectively connecting the sense amplifier during a read operation, are configured to allow either pre-discharging or connection to the sense amplifier at any one time but not both.

18. A ROM structure of claim 17, wherein, during a read operation, the pre-discharging circuit is disconnected and the sense amplifier is connected.

* * * * *